United States Patent
Yamaue (10) Patent No.: US 11,930,680 B2
(45) Date of Patent: Mar. 12, 2024

(54) DISPLAY DEVICE AND METHOD FOR PROVIDING EFFICIENT DISPLAY QUALITY WHEN A COVER GLASS IS ATTACHED TO DISPLAY SURFACE

(71) Applicant: SHARP KABUSHIKI KAISHA, Sakai (JP)

(72) Inventor: Takahiro Yamaue, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 510 days.

(21) Appl. No.: 17/273,929

(22) PCT Filed: Sep. 13, 2018

(86) PCT No.: PCT/JP2018/034047
§ 371 (c)(1),
(2) Date: Mar. 5, 2021

(87) PCT Pub. No.: WO2020/054039
PCT Pub. Date: Mar. 19, 2020

(65) Prior Publication Data
US 2021/0399063 A1 Dec. 23, 2021

(51) Int. Cl.
*H10K 59/35* (2023.01)
*G09G 3/3225* (2016.01)
*H10K 59/12* (2023.01)
*H10K 59/131* (2023.01)
*H10K 71/00* (2023.01)

(52) U.S. Cl.
CPC ......... *H10K 59/353* (2023.02); *G09G 3/3225* (2013.01); *H10K 59/131* (2023.02); *H10K 71/00* (2023.02); *G09G 2300/0452* (2013.01); *H10K 59/1201* (2023.02)

(58) Field of Classification Search
CPC .................... H10K 59/131; G09G 2300/0452
USPC ......................................................... 257/40
See application file for complete search history.

(56) References Cited

U.S. PATENT DOCUMENTS

| | | |
|---|---|---|
| 2005/0007539 A1 | 1/2005 | Taguchi et al. |
| 2011/0037786 A1 | 2/2011 | Hasegawa et al. |
| 2015/0015934 A1 | 1/2015 | Yamada et al. |
| 2017/0337877 A1 | 11/2017 | Kim et al. |
| 2021/0027716 A1* | 1/2021 | Yamada ............... G09G 3/3266 |
| 2022/0052145 A1* | 2/2022 | Yamada ............... H10K 59/121 |
| 2023/0090537 A1* | 3/2023 | Mimura ............... H10K 59/873 257/40 |

FOREIGN PATENT DOCUMENTS

| | | |
|---|---|---|
| JP | H11109404 A | 4/1999 |
| JP | 2004341213 A | 12/2004 |

(Continued)

*Primary Examiner* — Nduka E Ojeh
(74) *Attorney, Agent, or Firm* — ScienBiziP, P.C.

(57) ABSTRACT

A display device includes a display substrate including a plurality of pixels and including an active area longer than a display region, and a frame region formed to surround the active area, and a cover glass attached to a display surface side of the display substrate. A frame is provided in a periphery of the cover glass, and the frame covers an outer periphery of the active area. The display region is a region where the active area and a region surrounded by the frame of the cover glass overlap each other.

12 Claims, 8 Drawing Sheets (56) References Cited

FOREIGN PATENT DOCUMENTS

| JP | 2011039311 A | 2/2011 |
|---|---|---|
| JP | 2013190526 A | 9/2013 |
| JP | 2015018062 A | 1/2015 |
| JP | 2015138217 A | 7/2015 |

\* cited by examiner

DISPLAY DEVICE AND METHOD FOR PROVIDING EFFICIENT DISPLAY QUALITY WHEN A COVER GLASS IS ATTACHED TO DISPLAY SURFACE

TECHNICAL FIELD

The disclosure relates to a display device configured to display video such as a character and an image in a display surface, and a method for manufacturing the same.

BACKGROUND ART

In the related art, it is known that in a display device, for example, a cover glass including a frame including a periphery printed in black color is provided, and the cover glass is attached to a display surface of the display device (for example, see PTL 1 below).

CITATION LIST

Patent Literature

PTL 1: JP 2015-018062 A

SUMMARY

Technical Problem

However, in the display device of the related art as described above, in a case where a shift occurs in the attachment of the cover glass to the display surface, a dummy region that does not contribute to display may be present inside the frame, or an outer peripheral edge of a display region may be covered with the frame. As a result, in such a display device of the related art, there has been a problem of a decrease in display quality.

An object of the disclosure is to provide a display device that can prevent a decrease in display quality even in a case where a shift occurs in attachment of a cover glass to a display surface, and a method for manufacturing the same.

Solution to Problem

To achieve the object described above, a display device according to the disclosure includes a display substrate including a plurality of pixels and including an active area longer than a display region and a frame region formed to surround the active area, and a cover glass attached to a display surface side of the display substrate, wherein a frame is provided in a periphery of the cover glass, and the display region is a region where the active area and a region surrounded by the frame of the cover glass overlap each other.

Advantageous Effects of Disclosure

According to a display device of the disclosure, even in a case where a shift occurs in attachment of a cover glass to a display surface, a decrease in display quality can be prevented.

DESCRIPTION OF EMBODIMENTS

Hereinafter, embodiments of the disclosure will be described with reference to the drawings.

First Embodiment

Figure 1:
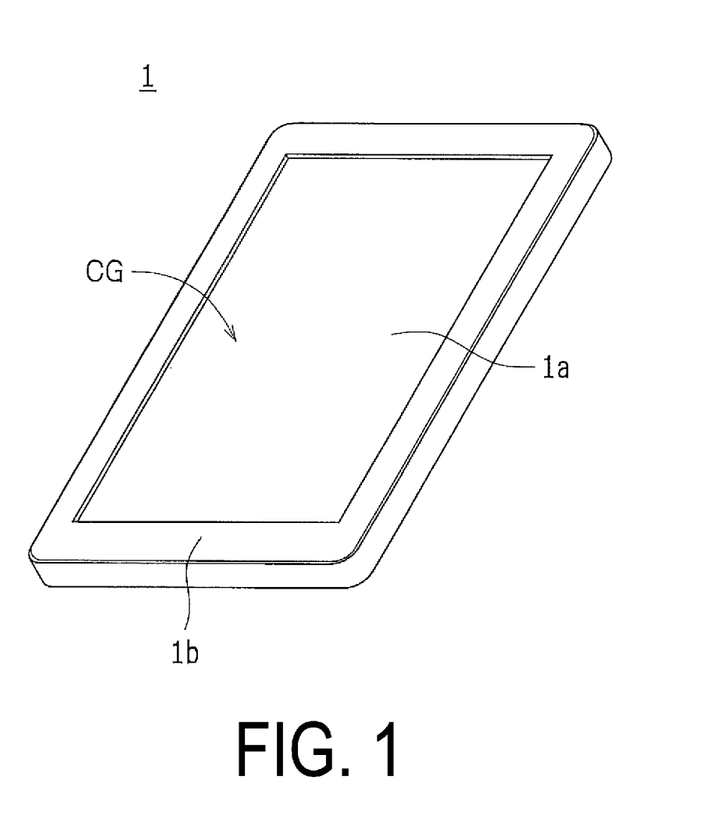
FIG. 1 is a perspective view illustrating appearance of a display device according to a first embodiment of the disclosure.

FIG. 1 is a perspective view of a display device according to a first embodiment.

In the figure, a display device 1 constitutes a display portion of a tablet terminal, a notebook personal computer, a mobile phone such as a smartphone, or the like. In the figure, a tablet terminal is illustrated.

The display device 1 is an organic electro luminescence (EL) display, or the like. In addition, the display device 1 includes a display surface 1a that displays video such as a character and an image in an upper face center portion of the display portion.

A cover glass CG is attached to the display surface 1a. The cover glass CC protects the display surface 1a. The cover glass CC is formed from a material having excellent impact resistance performance, for example, tempered glass or the like. A transparent adhesive (not illustrated) is disposed in a lower face (a back face) of the cover glass CC, and is bonded to the display surface 1a by the adhesive.

Peripheries of the display surface 1a and the cover glass CG are surrounded by a bezel 1b, and the display surface 1a and the cover glass CG are held collectively by the bezel 1b.

Figure 2:
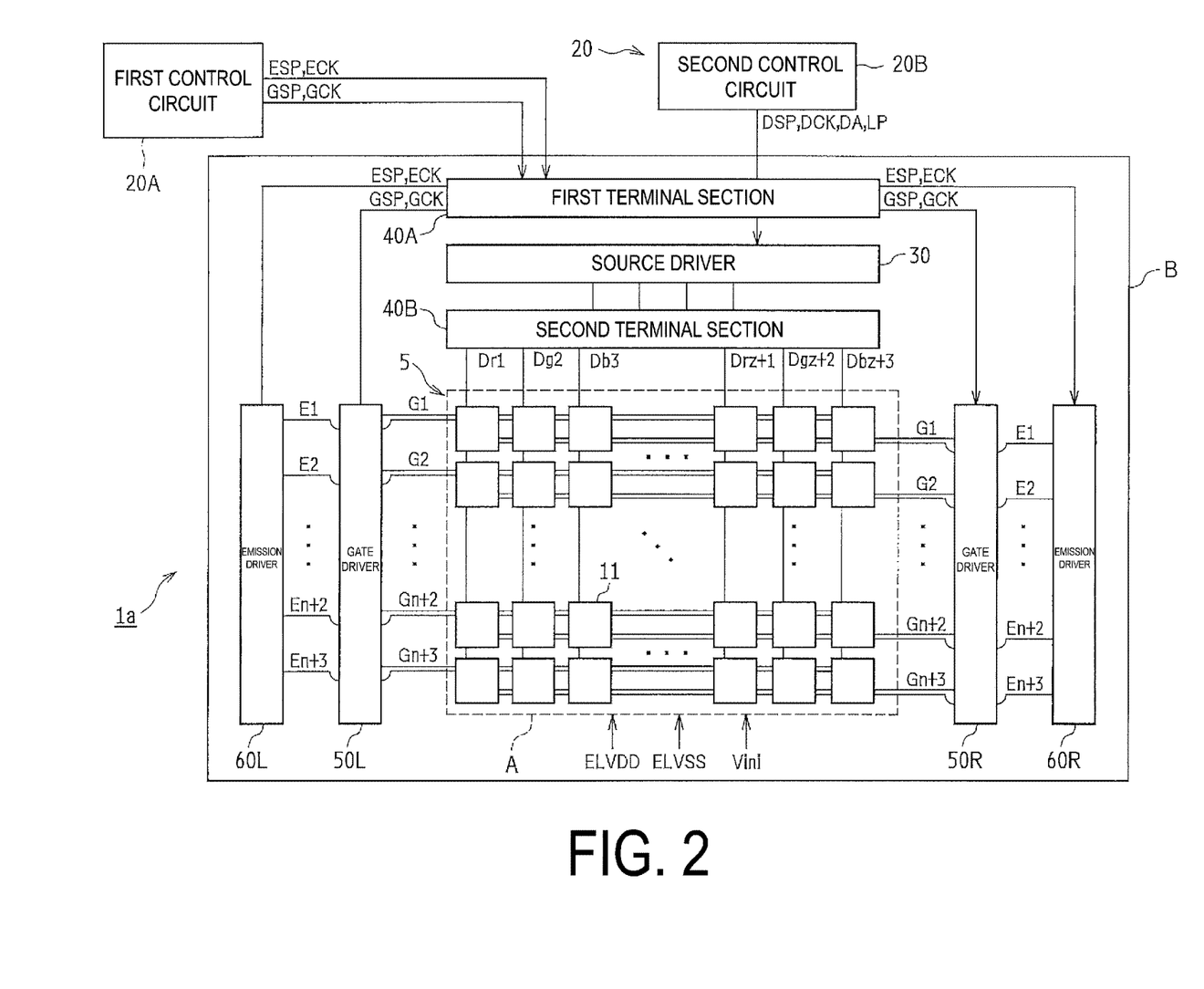
FIG. 2 is a plan view illustrating a specific example of a circuit configuration of the display device.

FIG. 2 is a plan view illustrating a specific example of a circuit configuration of the display device 1. In the display device 1, color display in RGB tri-primary color can be performed in the display surface 1a. The display surface 1a includes an active area A including a plurality of pixels and a frame region B positioned in a periphery of the active area A, In addition, in the active area A of the display device 1, a display region substantially displaying video is defined by a frame of the cover glass as described in detail below. Further, in the display device 1 of the present embodiment, no dummy pixel is formed, and the display region can be adjusted according to the frame of the cover glass. That is, the active area A is a region enabling light emission where a light-emitting element and a pixel circuit are formed, and is a region including a display region defined when the cover glass is bonded. In addition, as described below, a region where the active area A overlaps a region surrounded by the frame of the cover glass CG includes a display region that actually contributes to display of video.

In the frame region B, a first terminal section 40A and a second terminal section 40B arc provided in a region in an upper portion in the figure. Further, in the frame region B, a source driver 30 installed between the first terminal section 40A and the second terminal section 40B is provided in a side of an upper side (a first side) facing the first and second terminal sections 40A and 408 of the active area A. A control circuit 20 includes a first control circuit 20A and a second control circuit 20B, and is provided outside the frame region 13 (namely, outside a display substrate 5). On the other hand, in a side of a left side (a second side) orthogonal to the first side, an emission driver 60L in the left side (an emission driver)and a gate driver 50L in the left side (a gate driver) are provided in a left side portion in the figure. In addition, in a side of a right side (a third side) facing the left side, a gate driver 50R in the right side (a second gate driver) and an emission driver 60R in the right side (a second emission driver) are provided in a right side portion of the figure.

Namely, in the display device 1 of the present embodiment, a plurality of gate lines G1 to Gn+3 and a plurality of emission lines E1 to En+3 are driven (driven in both sides) by the corresponding gate drivers 50L and 50R and the corresponding emission drivers 60L and 60R, respectively. That is, one end and the other end of each of the gate lines G1 to Gn+3 are electrically connected to the gate driver 50L and the gate driver 50R, respectively. In addition, one end and the other end of each of the emission lines E1 to En±3 are electrically connected to the emission driver 60L and the emission driver 60R, respectively. In this way, in the display device 1, since the gate lines G1 to Gn+3 and the emission lines E1 to En+3 are driven in both sides, even when the size of the display surface of the display device 1 is increased, a gate signal and an emission signal can be supplied stably to each of the gate lines G1 to Gn+3 and each of the emission lines E1 to En+3, respectively, and the reliability of the display device 1 can be improved easily.

Note that the display device 1 of the present embodiment is not limited to this. For example, there may be a so-called single-side drive configuration where one gate driver and one emission driver along the second side are provided, and a gate line and an emission line each including only one end electrically connected to the gate driver and the emission driver are provided.

In the active area A, z+3 data lines of data lines Dr1 to Dbz+3 and n+3 gate lines of the gate lines G1 to Gn+3 orthogonal to the z+3 data lines of the data lines Dr1 to Dbz+3 are disposed. In addition, n+3 emission lines of the emission lines E1 to En+3 are disposed in parallel to the gate lines G1 to Gn+3.

Further, the active area A is provided with (z+3)/(n+3) subpixels corresponding to intersection points between the data lines and the gate lines and electrically connected to the data lines, the gate lines and the emission lines. Each of the subpixels 11 includes a circuit configuration illustrated in FIG. 3.

Each of the data lines Dr1 to Dbz+3 is connected to the second terminal section 40B.

The first control circuit 20A inputs various control signals to the gate drivers 50R and 50L and the emission drivers 60R and 60L via the first terminal section 40A. More specifically, the first control circuit 20A inputs a gate start pulse GSP and a gate clock GCK to the gate drivers 50R and 50L via the first terminal section 40A. Further, the first control circuit 20A inputs an emission start pulse ESP and an emission clock ECK to the emission drivers 60R and 60L.

The first terminal section 40A sequentially distributes the gate start puke GSP and the gate clock GCK from the first control circuit 20A to the gate drivers 50R and 50L, and inputs the emission start pulse ESP and the emission clock ECK from the first control circuit 20A to the emission drivers 60R and 60L.

The second control circuit 20B inputs various control signals to the source driver 30. More specifically, the second control circuit 20B inputs a data start pulse DSP, a data clock DCK, display data DA, and a latch pulse LP to the source driver 30. The display data DA includes R data, G data, and B data.

The source driver 30 analog-converts received one row of the display data DA into a data signal, and sequentially supplies one row of data signals (an R data signal, a G data signal, and a B data signal) after the conversion to each of the data lines Dr1 to Dbz+3 via the second terminal section 40B.

The second terminal section 40B sequentially supplies one row of data signals from the source driver 30 to each of the data lines Dr1 to Dbz+3.

Figure 3:
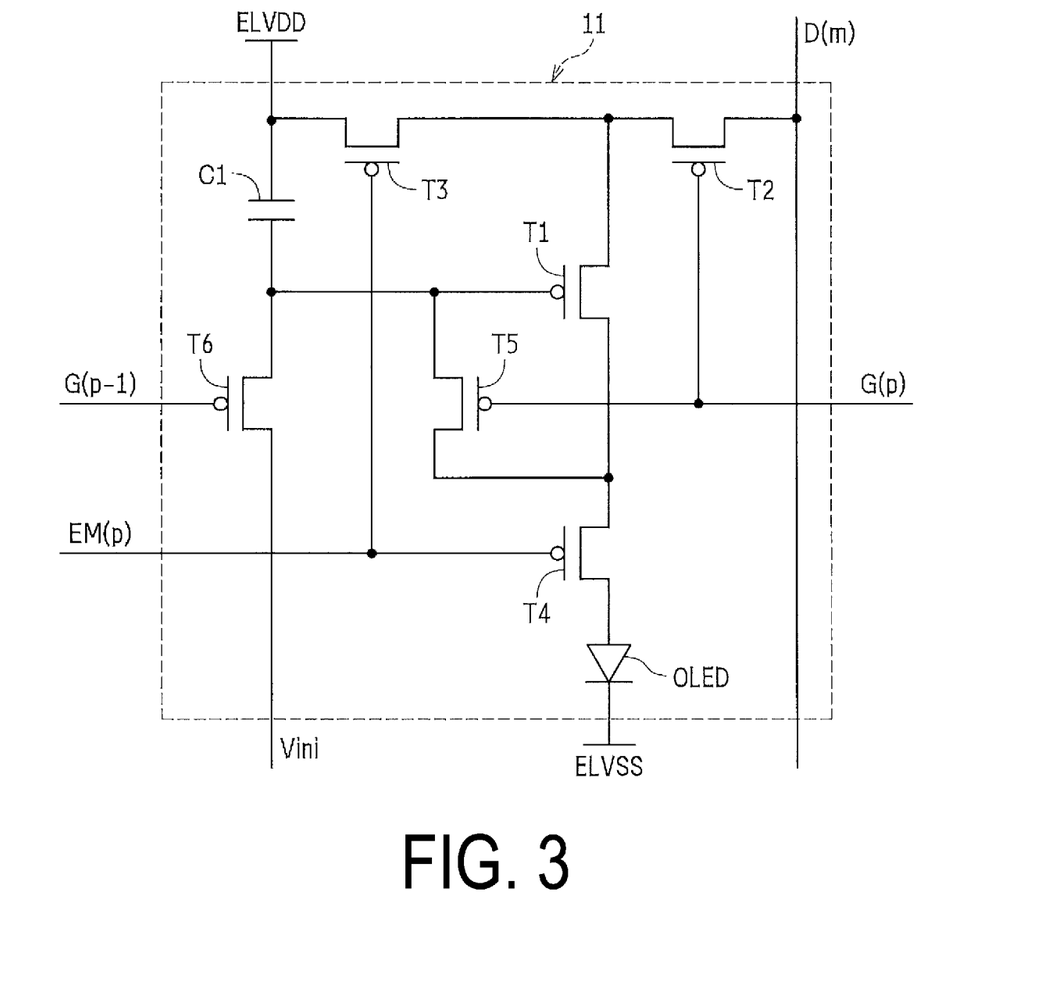
FIG. 3 is a circuit diagram illustrating a configuration of a subpixel of a display region of the display device.

A configuration of the subpixel 11 will be described with reference to FIG. 3. The subpixel 11 illustrated in FIG. 3 is provided to correspond to an intersection between an mth data line $D(m)(m=1$ to $z+3)$ and a pth gate line $G(p)(p=1$ to $n+3)$. A high-level power supply voltage ELVDD for driving an organic EL element OLED, a low-level power supply voltage ELVSS for driving an organic EL element OLED, and an initialization voltage Vini are supplied to the subpixel 11. The subpixel 11 includes one organic EL element OLED, six transistors T1 to T6 (specifically, a drive transistor T1, a writing control transistor T2, a power supply control transistor T3, a light emission control transistor T4, a threshold voltage compensation transistor T5, and an initialization transistor T6), and one capacitor C1. The transistors T1 to T6 are p-channel transistors. The capacitor C1 is a capacitance element including two electrodes. The transistors T1 to T6 may be constituted by n-channel transistors. Note that the configuration of the subpixel 11 illustrated is exemplary, and other known configurations can be employed.

Cover Glass and Display Region

Subsequently, bonding of the cover glass CG, and a display region according to a position of the cover glass CG will be described with reference to FIG. 4.

Figure 4:
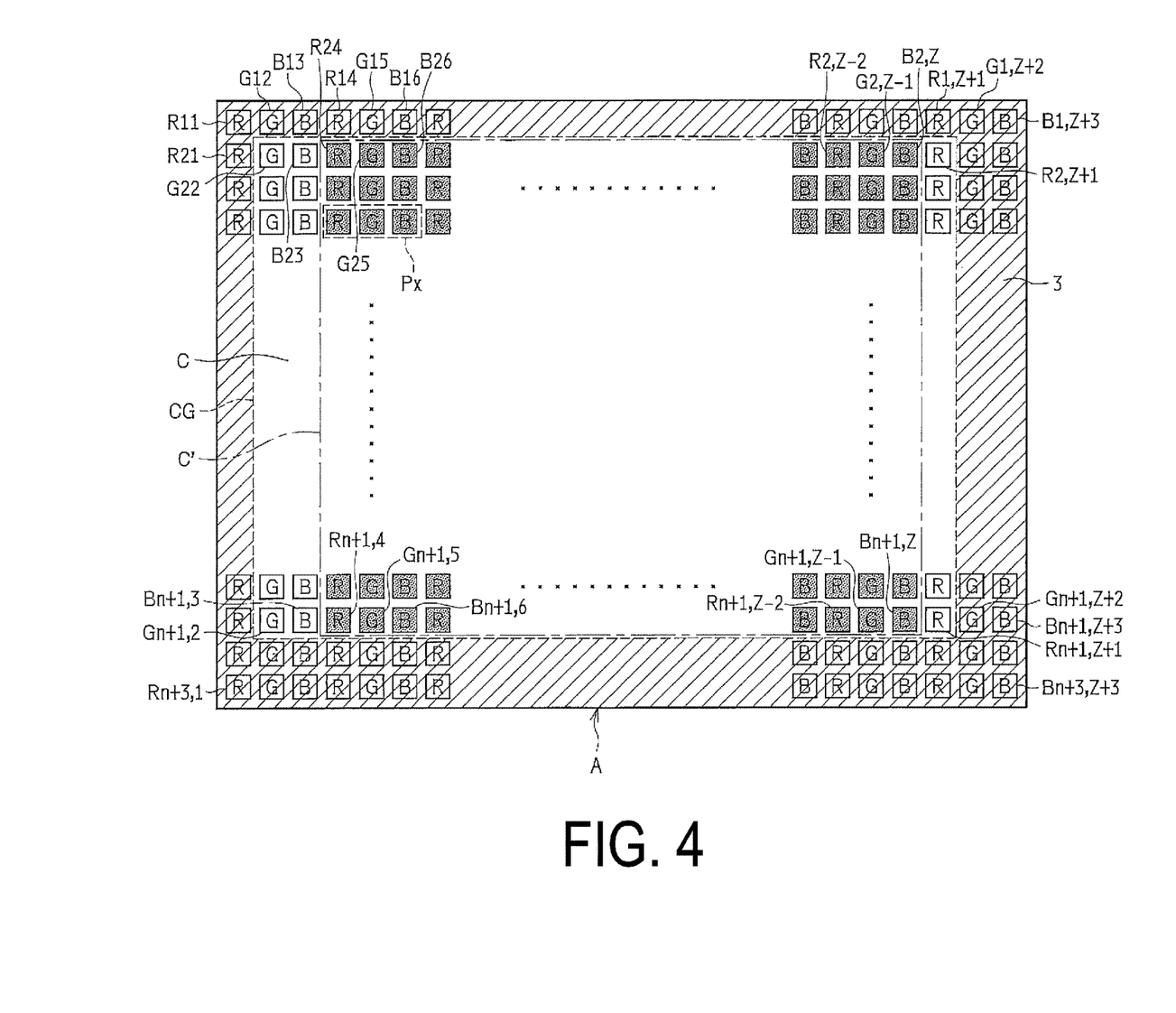
FIG. 4 is an explanatory view illustrating a display region in a state where a cover glass is attached to a display surface of the display device.

In FIG. 4, the active area A is constituted by arranging the subpixels 11 of RGB in a matrix shape of Z+3 subpixels 11 in the horizontal direction (Z is a natural number that is a multiple of three), and n+3 subpixels 11 in the vertical direction (n is a natural number that is a multiple of three). The subpixels 11 are repeatedly arranged in a vertical stripe shape in order of a color array of R, G, and B from the left in the figure. The order of the color array is exemplary, and, for example, a color array of BRG or a color array of four kinds of color where yellow "Y" or white "W" is added to RGB, and the like may be employed. In the present embodiment, one pixel is constituted as a set of three subpixels of RGB. In the color array of four kinds of color where yellow "Y" or white "W" is added, one pixel is constituted as a set of subpixels of four or more kinds of color.

In addition, the cover glass CG is disposed to overlap an upper face of the active area A. A frame 3 including an outer periphery printed in black is formed in the cover glass CG. In the figure, an inner edge of the frame (hereinafter referred to as a black frame) 3 of the cover glass CG is indicated by a dashed line. In addition, in the black frame 3, a region positioned in an upper portion of the active area A is illustrated by hatching in the figure. An inner region surrounded by the black frame 3 of the cover glass CG is narrower than the active area A, and is a region where z subpixels of the subpixels 11 of RGB are disposed in the horizontal direction and n subpixels of the subpixels 11 of RGB are disposed in the vertical direction.

That is, the active area A is set to be a region having a size greater than the region surrounded by the black frame 3 of the cover glass CG such that three subpixels 11 are added in the horizontal direction and one subpixel 11 is added in the vertical direction. In an outer peripheral region of the active area A that is longer than the region surrounded by the black frame 3 of the cover glass CG, a subpixel positioned in the outer peripheral region becomes, according to a bonding position of the cover glass CG, a subpixel that is not used for display of a character or the like when the subpixel is positioned below the black frame 3, and becomes a regular subpixel that is used for display when the subpixel is positioned in the region surrounded by the black frame 3. Note that the region surrounded by the black frame 3 refers to a region of the interior of the black frame 3 without including a region positioned below the black frame 3 (that is, overlapping the black frame 3).

In FIG. 4, in a state where the cover glass CG is disposed to overlap the upper face of the active area A, a region where the active area. A and the region surrounded by the black frame 3 of the cover glass CC overlap each other is a display region C actually contributing to display of video (details will be described below). Specifically, in the example of FIG. 4, in the inner edge of the black frame 3 of the cover glass CG, an inner edge of a left end in the figure is shifted to the right side of the R subpixel 11 in a first column of a left end of the active area A, and an inner edge of an upper end is shifted to the lower side of the subpixel 11 of RGB in a first row of an upper end of the active area A. Accordingly, an inner edge of a right end in the figure of the black frame 3 of the cover glass CG is positioned in the left side of the subpixels 11 of G and B in a (z+2)th column and a (z+3)th column of a right end of the active area A, and in addition, an inner edge of a lower end in the figure of the black frame 3 is positioned in the upper side of the subpixels 11 of RGB in a (n+3)th row and a (n+2)th row of a lower end of the active area A.

Accordingly, in FIG. 4, when a position of each of the subpixels 11 is represented by color of the subpixel, a row position i and a column position j, the subpixel 11 in an upper left corner portion is G22 (ij=22 for a green subpixel), the subpixel 11 in an upper right corner portion is R2, z+1, the subpixel 11 in a lower left corner is Gn+1, 2, the subpixel 11 in a lower right corner portion is Rn+1, z+1, and the display region C actually contributing to display includes the four subpixels and a total of z×n subpixels 11 positioned among the four subpixels. Since the subpixels 11 other than these subpixels in the active area A are positioned below the black frame 3 of the cover glass CG, the subpixels 11 do not actually contribute to display, and thus are not under lighting (display) control.

With respect to the display region C according to the bonding of the cover glass CG illustrated in FIG. 4, the control circuit 20 (see FIG. 2) drives the data lines Dr1 to Dbz+3, or the gate lines G1 to Gn+3 and the emission lines E1 to En+3 to control each of the subpixels 11 in the display region C, and uses each of the subpixels 11 in the display region C for actual display of video.

Specifically, the first control circuit 20A inputs a gate signal and an emission signal to the gate drivers 50R and 50L and the emission drivers 60R and 60L, respectively, to drive only the gate lines G2 to Gn+1 and the emission lines E2 to n+1 that lead ton rows of the respective subpixels 11 from a second row to a (n+1)th row.

On the other hand, with respect to n×z subpixels of the subpixels 11 in the display region C, the second control circuit 20B drives the source driver 30 to repeatedly constitute one pixel in combination of three subpixels arranged in a color array that matches a color array of the subpixels of the active area A (the color array in order of RGB from the left), that is, the color array of RGB in order from the left (along the first side). Specifically, for example, in the second row of the subpixels, one first pixel is constituted by a subpixel R24 first matching the color "R" from the left in the figure and two subpixels G25 and B26 of the color G and the color B positioned in the right side of the subpixel R24, and one pixel is repeatedly constituted by three subpixels of RGB positioned in the right side of the one pixel, and one pixel is constituted by three subpixels of RGB positioned at the end R2, z–2, G2, z–1 and B2, z, and a source signal is input to the source driver 30 to drive each set of data. lines Drj, Dgj+1 and Dbj+2 (j=4 to z–2) with respect to each of those pixels.

As surrounded by a dot-dash line of FIG. 4, the subpixels 11 inside a substantial display region C' that are driven and controlled by the first and second control circuits 20A and 20B are displayed by shading. As can be seen from the figure, in the present embodiment, since the one pixel is constituted by a combination of three subpixels in order of the color array of RGB from the left, the subpixels in second and third columns of the active area A (that is, first and second columns of the display region C) are not driven and controlled. Similarly, the subpixels in a (z+1)th column of the active area A (that is, a zth column of the display region C) are not driven and controlled.

That is, the first control circuit 20A inputs a gate signal to the gate drivers 50L and 50R and inputs an emission signal to the emission drivers 60L and 60R to drive the gate line G2 and the emission line E2 corresponding to subpixels positioned first in the upper side of the display region C (a first subpixel), that is, the subpixels R24 to R2, z+1 in the second row.

In addition, when the color R of base end subpixels R11 to Rn+3, 1 positioned first in a side of the left side of the active area A is different from the color G of the subpixel positioned first in a side of the left side of the display region C (a second subpixel), that is, the subpixels G22 to Gn+1, 2 in the second column, the second control circuit 20B constitutes one pixel in the row direction and n pixels in the column direction by the subpixels R24 to Rn+1, 4 having color first matching the color R of the base end subpixels R11 to Rn+3, 1 in a side of the left side of the display region C, and subpixels of the other two kinds of color GB positioned in a side of the right side of the subpixels R24 to Rn+1, 4 (G25 to Gn+1, 5), and (B26 to Bn+1, 6), and inputs a control signal to the source driver 30 such that a data signal is input to the data line Dr4 corresponding to the subpixels R24 to Rn+1, 4 having color first matching the color R of the base end subpixels R11 to Rn+3, 1.

Method for Manufacturing Display Device 1

Next, a method for manufacturing the display device 1 for displaying a character and the like in the display region C according to the bonding position of the cover glass CG will be described with reference to FIG. 5.

In the following description of FIG. 5, a state where the cover glass CG overlaps and is bonded to the upper face of the active area A as illustrated in FIG. 4 will be described exemplarily.

Figure 5:
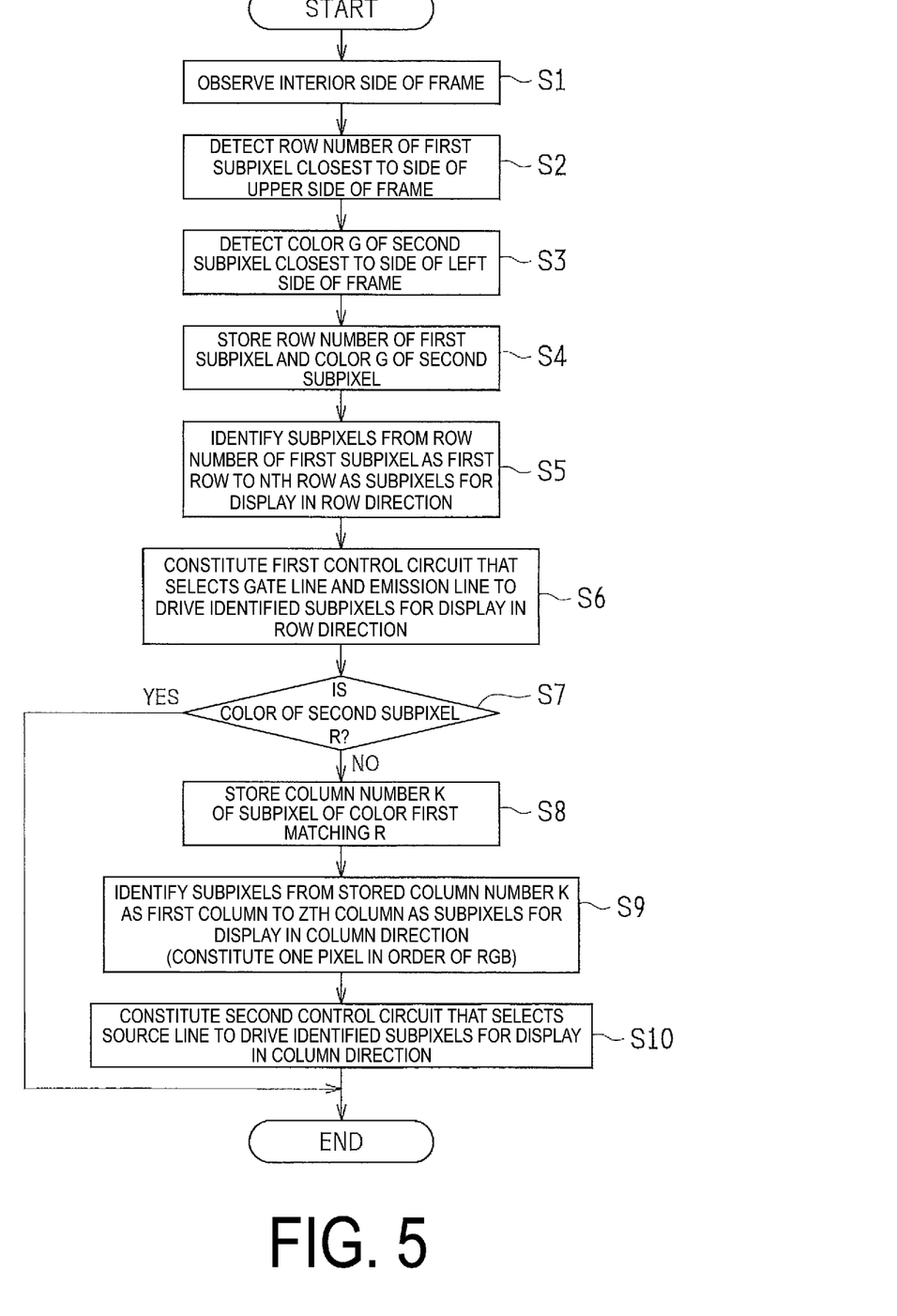
FIG. 5 is a flowchart illustrating a method for manufacturing the display device.

In FIG. 5, at step S1, in a state where the cover glass CG overlaps and is bonded to the upper face of the active area A as illustrated in FIG. 4, an interior side of the inner edge side of the black frame 3 of the cover glass CG, that is, an outer peripheral edge portion of the display region C is visually observed (a first step). Note that, although the outer peripheral edge portion of the display region C is visually observed at step S1, the outer peripheral edge portion of the display region C may be detected by, for example, an automated optical inspection (AOI) device instead of the visual observation.

Then, at step S2, a row number "2" of subpixels closest to a side of an upper side of an inner peripheral edge of the black frame 3, that is, subpixels positioned in an upper end of the display region C (the subpixels G22 to R2, z+1 in the second row) (hereinafter, the subpixels are referred to as first subpixels) are detected (a second step).

Further, at step S3, the color "G" of subpixels closest to a side of the left side in the figure of the inner peripheral edge of the black frame 3, that is, subpixels positioned in a left end of the display region C (the subpixels G22 to Gn+1, 2 in the second column) (hereinafter, the subpixels are referred to as second subpixels) are detected (a third step).

Next, at step S4, the detected row number "2" of the first subpixels G22 to R2, z+1 and the color "G" of the second subpixels G22 to Gn+1, 2 are stored (a fourth step).

Subsequently, at step S5, subpixels from the row number "2" of the first subpixels G22 to R2, z+1 as the first row to an nth row are identified as subpixels for display in the row direction. Specifically, the subpixels Gn+1, 2 to Rn+1, z+1 in an n+1th row from the subpixels G22 to R2, z+1 in the second row are identified as subpixels for display in the row direction.

Further, at step S6, the first control circuit 20A that inputs a gate signal and an emission signal to the gate drivers 50R and 50L and the emission drivers 60R and 60L, respectively is configured to drive the identified subpixels for display (G22 to R2, z+1) to (Gn+1, 2 to Rn+1, z+1) in the row direction of the second row to the (n+1)th row, that is, to select and drive only the gate lines G2 to Gn+1 and the emission lines E2 to En+1 (a fifth step).

Subsequently, at step S7, it is determined whether or not the color "G" of the second subpixels G22 to Gn+1, 2 is the red "R" of the subpixel positioned in the left end of FIG. 4 of the active area A (hereinafter, the subpixel is referred to as a base end subpixel), and in a case where it is determined that the color is the color "R", the processing immediately ends. On the other hand, in a case where the color is not the color "R", at step S8, first, a column number k (k="4") of the subpixels R24 to Rn+3, 4 of the color "R" that first matches the color "R" of the subpixels positioned in the right side of FIG. 4 of the second subpixels G22 to Gn+1, 2 is stored to match the color array of the subpixels of the active area A (the color array of RGB in order from the left). Then, at step S9, the subpixels (R14 to Rn+3, 4) to (B1z to Rn+3, z) from the column number k (k="4") of the subpixels R24 to Rn+3, 4 of the color "R" stored as the first column to a (z+k−1)th column are identified as subpixels for display in the column direction. Since the identified subpixels for display in the column direction are arranged in the color array of RGB in order from the left in the row direction, a set of three subpixels arranged in the color array of RGB are identified to constitute one pixel PX.

Then, at step S10, the second control circuit 20B that inputs a source signal to the data lines Dr4 to Dbz is configured to drive only the identified subpixels (R14 to Rn+3, 4) to (B1z to Rn+3, z) for display in the column direction (a sixth step).

Accordingly, in the present embodiment, the active area A including the region larger than the region surrounded by the black frame 3 of the cover glass CG is formed, and the cover glass CG is bonded to the upper face of the active area A, and the region where the active area A and the region surrounded by the black frame 3 of the cover glass CG overlap in this state is formed as the display region C, and thus even in a case where the cover glass CG is shifted from left to right or up and down when the cover glass CG is bonded to the upper face of the active area A, a position of the display region C changes left to right or up and down according to a positional shift of the cover glass CG. Thus, since the display region C is always constituted by a partial region of the active area A, video is securely displayed in the display region C as expected.

Here, in a case where the black frame 3 of the cover glass CG is shifted by one row in the downward direction as illustrated in FIG. 4, the first control circuit 20A inputs a gate signal and an emission signal to the gate drivers 50R and 50L, and the emission drivers 60R and 60L, respectively, to drive only the gate lines G2 to Gn+1 and the emission lines E2 to En+1 that are electrically connected to the n rows of the subpixels from the second row to the (n+1)th row in the display region C, and thus it is possible to securely display and control the subpixels from the second row to the (n+1)th row in the display region C.

In addition, in a case where the black frame 3 of the cover glass CG is shifted by one row in the right direction as illustrated in FIG. 4, the second control circuit 20B inputs a source signal to the data lines Dr4 to Dbz to drive only the subpixels (R14 to Rn+3, 4) to (B1z to Rn+3, z) from a fourth column to the zth column arranged in the color array of RGB in order from the left in the display region C. Accordingly, the subpixels (G22 to Gn+1, 2) to (B23 to Bn+1, 3) of the color GB in the second column and the third column positioned in the left end of FIG. 4 of the display region C are not driven and controlled and do not emit light. In addition, the subpixels (R2, z+1 to Rn+1,z+1) of the color R in the (z +1)th column positioned in the right end of FIG. 4 of the display region C are not driven and controlled and do not emit light. As a result, since the subpixels in the color array in order of RGB that are closest to the left end portion and the right end portion of the display region C emit white light as one pixel, it is possible to improve color display in the left end portion and the right end portion of the display region C close to the inner edge of the black frame 3 of the cover glass CG.

As described above, in the display device 1 of the present embodiment, even in a case where a shift occurs in the attachment of the cover glass CG to the display surface 1a, a decrease in display quality can be prevented. Further, a decrease in a manufacturing yield of the display device 1 due to a shift in the attachment of the cover glass CG to the display surface 1a can be prevented, and the display device 1 having excellent productivity can be constituted.

Second Embodiment

Next, a display device of a second embodiment of the disclosure will be described with reference to FIG. 6.

Figure 6:
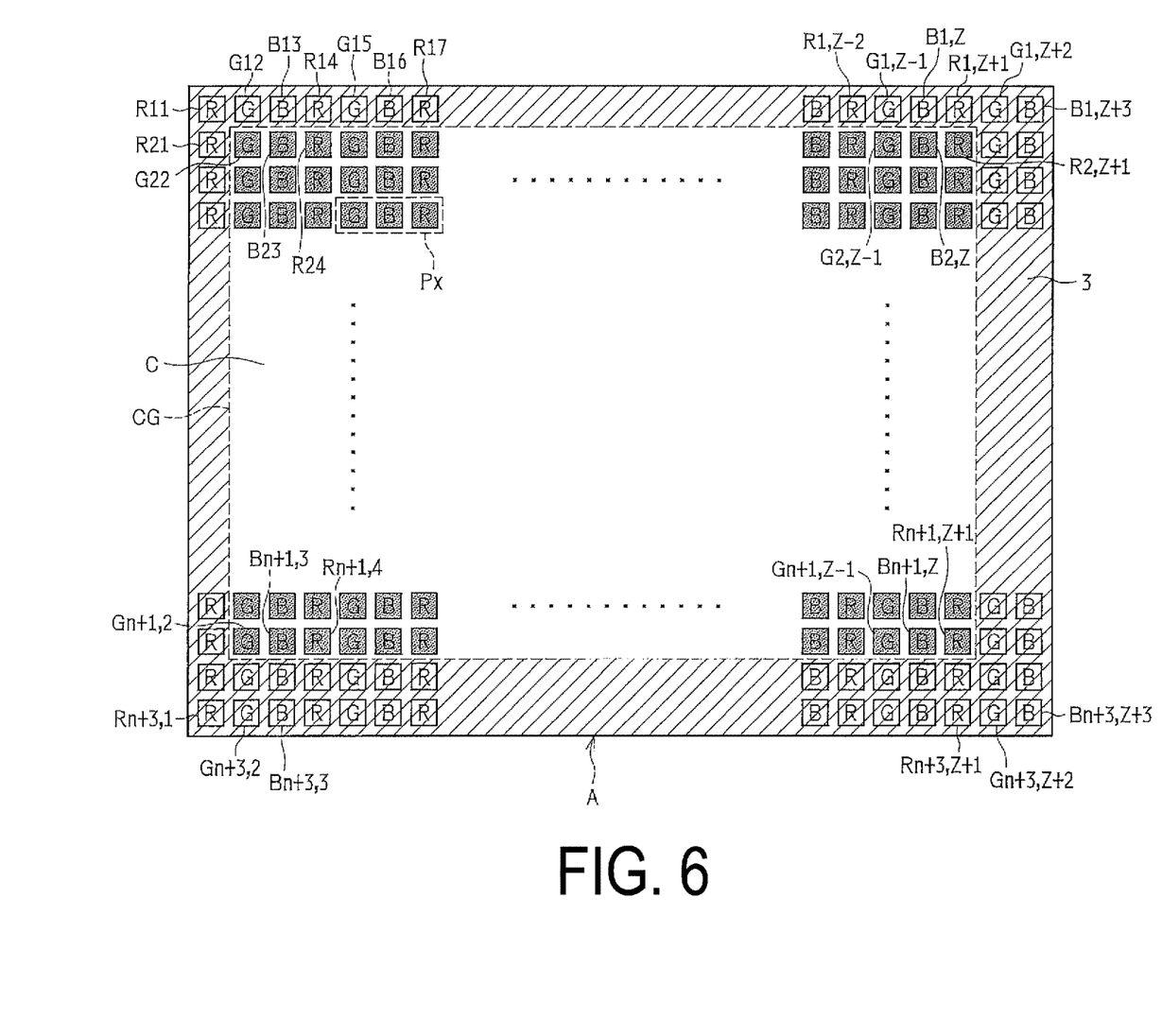
FIG. 6 is an explanatory view illustrating a display region in a state where a cover glass is attached to a display surface of a display device according to a second embodiment of the disclosure.

FIG. 6 illustrates a state where a cover glass CG is disposed to overlap an upper face of an active area A. Similarly, in the present embodiment, as with the embodiment described above, a black frame 3 of the cover glass CG is positioned such that an upper side inner edge of the black frame 3 is shifted to the lower side from subpixels R11 to B1, z+3 in a first row of the active area A, and a left side inner edge of the black frame 3 is shifted to a right side of subpixels R11 to Rn+3, 1 in a first column of the active area A.

In the present embodiment, in a display region C, since color of subpixels G22 to Gn+1, 2 positioned in a left end in the figure is color "G", a configuration where three subpixels positioned in a color array of GBR in order from the left emit white light as one pixel is employed. In this configuration, the color array is different from a color array of subpixels of the active area A (a color array in order of RGB from the left).

That is, with respect to n×z subpixels of subpixels 11 in the display region C, a second control circuit 20B drives a data line Dm (m=2 to z+1) to repeatedly constitute one pixel PX by a combination of three subpixels arranged in order of the color array of GBR in the right direction in order from subpixels of the color "G" positioned in a left end in the figure of the display region C, that is, in a color array different from the color array of the subpixels of the active area A (the color array of RGB in order from the left). Specifically, for example, in subpixels in a second row, one first pixel is constituted by the subpixel G22 of the color "G" positioned in a left end of the display region C and two subpixels B23 and R24 of color "B" and color "R" positioned in the right side of the subpixel G22, and a source signal is input to a source driver 30 to drive a set of data lines Dg2, Db3 and Dr4 with respect to the one pixel.

That is, when the color R of the base end subpixels R11 to Rn+3, 1 positioned first in a side of a left side of the active area A is different from the color G of subpixels (second subpixels) positioned first in a side of a left side of the display region C, that is, the subpixels G22 to Gn+1, 2 in a second column, the second control circuit 20B constitutes one pixel in the row direction and n pixels in the column direction by the second subpixels G22 to Gn+1, 2 and subpixels of other two kinds of color BR positioned in a right side of the second subpixels G22 to Gn+1, 2 (B23 to Bn+1, 3) and (R24 to Rn+1, 4), and inputs a control signal to the source driver 30 such that a data signal is input to the data line Dg2 corresponding to the second subpixels G22 to Gn+1, 2.

A configuration of a first control circuit 20A is the same as that of the above-described embodiment.

In FIG. 6, the subpixels in the display region C driven and controlled by the first and second control circuits 20A and 20B are illustrated by shading. As can be seen from the figure, in the present embodiment, display control is performed on all subpixels belonging to the display region C.

Figure 7:
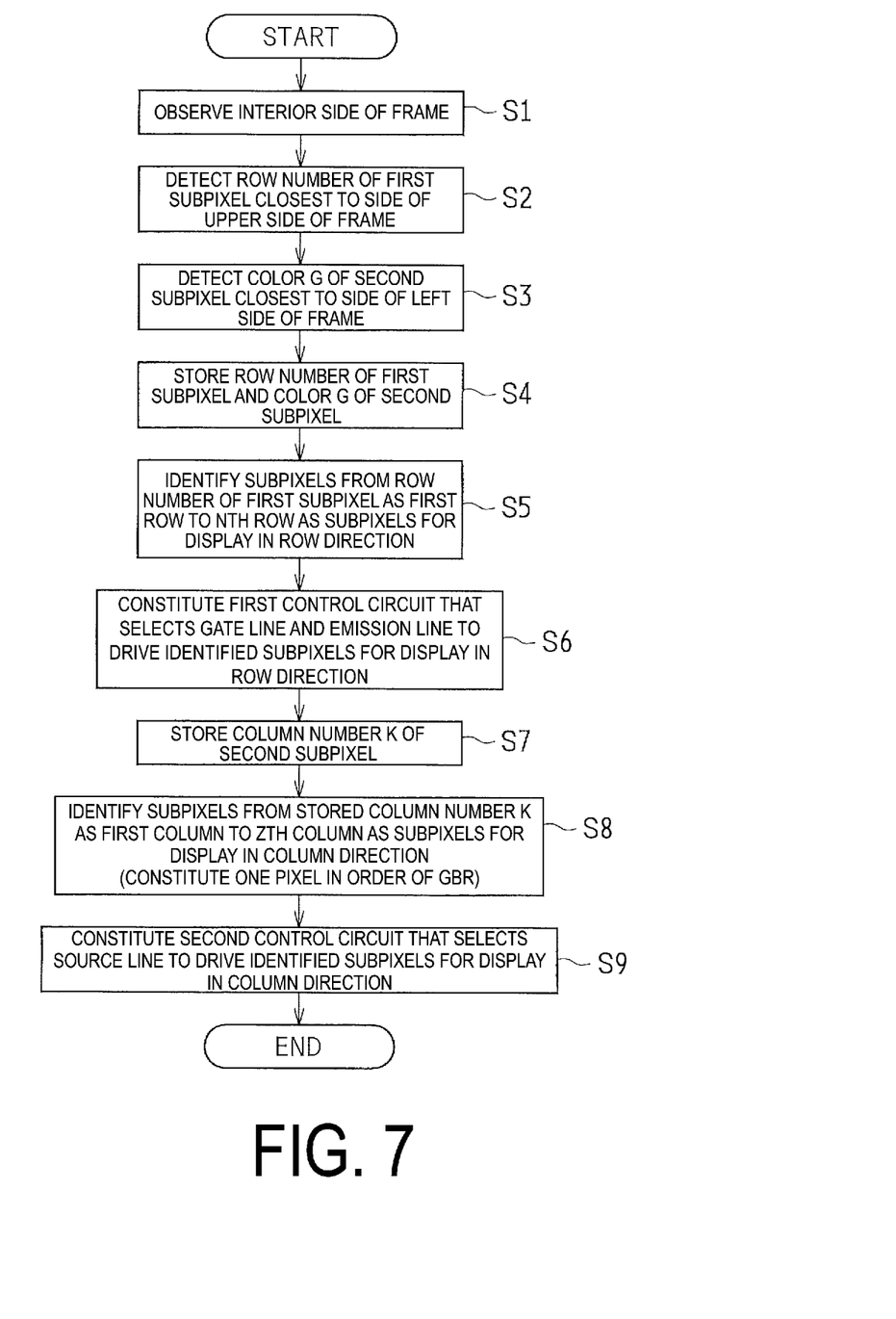
FIG. 7 is a flowchart illustrating a method for manufacturing the display device.

FIG. 7 is a flowchart illustrating a method for manufacturing the display device 1 of the present embodiment. In the figure, steps S1 to S6 are identical to steps S1 to S6 of the flowchart illustrated in FIG. 5 of the above-described embodiment.

In FIG. 7, at step S7, a column number k (K=2) of the second subpixels (the subpixels (G22 to Gn+1, 2) positioned in the left end of the display region C) is stored. Then, at step S8, z rows of the subpixels (G22 to Gn+1, 2) to (R2, z+1 to Rn+1, z+1) from the stored column number k as a first column to a zth column are identified as subpixels for display in the column direction. Here, the three subpixels positioned in order of the color array of GBR in the right direction from the subpixels (G22 to Gn+1, 2) positioned in the left end of the display region C emit white light as one pixel.

Then, at step S9, with respect to the identified subpixels (G22 to Gn+1, 2) to (R2, z+1 to Rn+1, z+1) for display in the column direction, the second control circuit 20B is configured to constitute one pixel by a combination of the subpixels in the color array of GBR different from the color array (the color array of RGB) of the subpixels of the active area A, and is configured to input a source signal to each of data lines Dg2 to Drz+1 while using a set of data lines Dgp, Dbp+1, Drp+2 (p=2 to z-1) (a sixth step).

Accordingly, in the present embodiment, the three subpixels positioned in the left end of the display region C closest to an inner edge of the black frame 3 of the cover glass CG and the three subpixels positioned in a right end can emit white light as one pixel, while using all of the subpixels belonging to the display region C, and thus. as compared to the above-described embodiment, it is possible to perform further improved color display.

Note that, in the description above, the case of setting the active area A to be longer than the region surrounded by the black frame 3 of the cover glass CG by three subpixels, that is, by one pixel is exemplified, but the disclosure is not limited to this case, and the number of subpixels may be set to be longer by one, two, or four or more subpixels according to accuracy of bonding of the cover glass CG to a display substrate 5.

Figure 8:
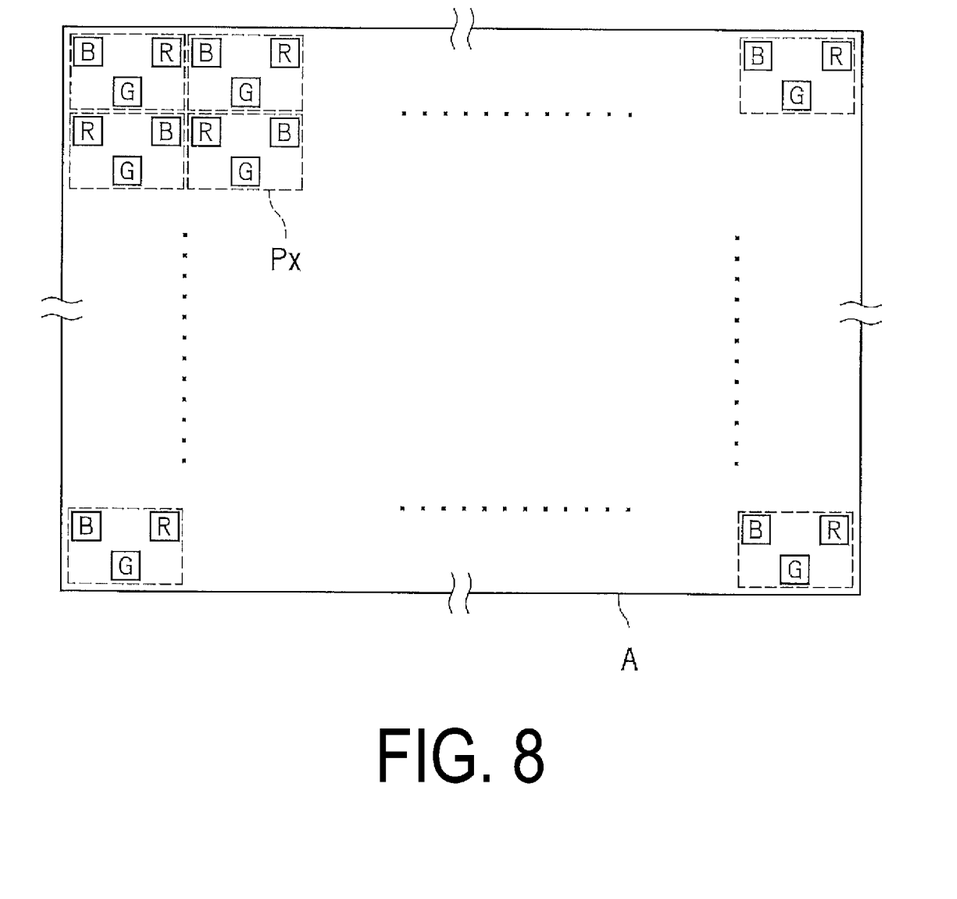
FIG. 8 is a view illustrating an example where an active area includes subpixels in PenTile arrangement.

In addition, in the description above, the one pixel is constituted by the three subpixels of RGB in stripe arrangement where the subpixels of RGB are arrayed in a vertical stripe shape, but the present inventiondisclosure is not limited to this, and one pixel may be constituted by three subpixels of RGB in PenTile arrangement. As illustrated in FIG. 8, for example, the PenTile arrangement is arrangement where subpixels of BR are disposed in a lattice pattern, and G subpixels are disposed at the center of four subpixels (two B subpixels and two R subpixels) in the lattice pattern. That is, each of the plurality of pixels in the active area A may constitute one pixel by subpixels of at least three kinds of color disposed in the same order in a direction parallel to the upper side (the first side) facing the first and second terminal sections 20A and 20B.

Further, in the description above, the first control circuit 20A and the second control circuit 20B are separately constituted, but the function of the first control circuit 20A and the function of the second control circuit 20B may be constituted by one control circuit.

The disclosure can be carried out in various other forms without departing from its spirit or main characteristics. Thus, the above-described embodiments are merely examples and are not be construed as limiting. Variations and modifications that fall within an equivalent of the scope of the claims of the disclosure are all within the scope of the disclosure.

The display according to the present embodiment is not particularly limited as long as the display is a display panel including a display element. The above-described display element includes a display element having a luminance or a transmittance controlled by a current and a display element having a luminance or a transmittance controlled by a voltage. Examples of the current-controlled display element include an organic electro luminescent (EL) display including an organic light emitting diode (OLED), or a quantum dot light emitting diode (QLED) display including an EL display QLED such as an inorganic EL display including an inorganic light-emitting diode. In addition, examples of the voltage-controlled display element include a liquid crystal display element and the like.

INDUSTRIAL APPLICABILITY

The disclosure is useful in a display device that can prevent a decrease in display quality even in a case where a shift occurs in attachment of a cover glass to a display surface.

REFERENCE SIGNS LIST

1 Display device
1a Display surface
A Active area
B Frame region
C Display region
CG Cover glass
3 Black frame (frame)
5 Display substrate
11 Subpixel
20 Control circuit
20A First control circuit
20B Second control circuit
30 Source driver
40A First terminal section
40B Second terminal section
50L Gate driver
50R (Second) gate driver
60L Emission driver
60R (Second) emission driver
Dr1 to Dbz+3 Data line
G1 to Gn+3 Gate line
E1 to En+3 Emission line

The invention claimed is:

1. A display device comprising:
a display substrate including a plurality of pixels, an active area longer than a display region, and a frame region formed to surround the active area; and
a cover glass attached to a display surface side of the display substrate,
wherein a frame is provided in a periphery of the cover glass,
the display region is a region where the active area and a region surrounded by the frame of the cover glass overlap each other,
the frame region is provided with a terminal section, a source driver disposed along a first side being a side facing the terminal section of the active area, and a gate driver and an emission driver that are disposed along a second side being a side orthogonal to the first side,
the active area is provided with
subpixels of at least three kinds of color constituting each of the plurality of pixels and disposed in the same order in a direction parallel to the first side in each of the plurality of pixels,
a plurality of data lines electrically connected to the source driver, the plurality of data lines provided in parallel to the second side and connected to the subpixels,
a plurality of gate lines electrically connected to the gate driver, the plurality of gate lines provided in parallel to the first side and connected to the subpixels, and
a plurality of emission lines electrically connected to the emission driver, the plurality of emission lines provided in parallel to the first side and connected to the subpixels,
a control circuit is provided and configured to control at least one of the source driver, the gate driver, and the emission driver and to drive the plurality of pixels according to the display region, and
the control circuit includes at least a second control circuit configured to constitute one pixel by a subpixel first matching a color of a base end subpixel and other subpixels of at least two kinds of color in a side of the second side of the display region and configured to input a control signal to the source driver and input a data signal to a data line, corresponding to the subpixel matching the color of the base end subpixel, when the color of the base end subpixel positioned first in a side of the second side of the active area is different from a color of a second subpixel positioned first in the side of the second side of the display region.

2. The display device according to claim 1,
wherein the control circuit further includes a first control circuit configured to input a gate signal to the gate driver and input an emission signal to the emission driver, and configured to drive a gate line corresponding to a first subpixel positioned first in a side of the first side of the display region and drive an emission line corresponding to the first subpixel.

3. The display device according to claim 1,
wherein the frame region is provided with a second gate driver and a second emission driver disposed along a third side facing the second side,
at least one of the plurality of gate lines includes one end electrically connected to the gate driver and another end electrically connected to the second gate driver, and
at least one of the plurality of emission lines includes one end electrically connected to the emission driver and another end electrically connected to the second emission driver.

4. The display device according to claim 1,
wherein each of the plurality of pixels includes the subpixels of at least three kinds of color arrayed in a stripe arrangement.

5. The display device according to claim 1,
wherein each of the plurality of pixels includes the subpixels of at least three kinds of color arrayed in a PenTile arrangement.

6. A method for manufacturing the display device according to claim 1, the method comprising:
observing an interior side of the frame;
detecting a first subpixel closest to a side of the first side of the frame;
detecting a second subpixel closest to a side of the second side of the frame;
storing the first subpixel and the second subpixel;
providing a first control circuit configured to input a gate signal to the gate driver and input an emission signal to the emission driver and configured to drive a gate line corresponding to the first subpixel and an emission line corresponding to the first subpixel; and
providing the second control circuit configured to constitute one pixel by a subpixel first matching color of a base end subpixel and other subpixels of at least two kinds of color in a side of the second side of the display region, and configured to input a control signal to the source driver and input a data signal to a data line corresponding to the subpixel matching the color of the base end subpixel.

7. A display device comprising:
a display substrate including a plurality of pixels, an active area longer than a display region, and a frame region formed to surround the active area; and a cover glass attached to a display surface side of the display substrate, wherein a frame is provided in a periphery of the cover glass, the display region is a region where the active area and a region surrounded by the frame of the cover glass overlap each other, the frame region is provided with a terminal section, a source driver disposed along a first side being a side facing the terminal section of the active area, and a gate driver and an emission driver that are disposed along a second side being a side orthogonal to the first side, the active area is provided with subpixels of at least three kinds of color constituting each of the plurality of pixels and disposed in the same order in a direction parallel to the first side in each of the plurality of pixels, a plurality of data lines electrically connected to the source driver, the plurality of data lines provided in parallel to the second side and connected to the subpixels, a plurality of gate lines electrically connected to the gate driver, the plurality of gate lines provided in parallel to the first side and connected to the subpixels, and a plurality of emission lines electrically connected to the emission driver, the plurality of emission lines provided in parallel to the first side and connected to the subpixels, a control circuit is provided and configured to control at least one of the source driver, the gate driver, and the emission driver and to drive the plurality of pixels according to the display region, and the control circuit includes at least a second control circuit configured to constitute one pixel by a second subpixel and other subpixels of at least two kinds of color and configured to input a control signal to the source driver and input a data signal to a data line corresponding to the second subpixel, when a color of a base end subpixel positioned first in a side of the second side of the active area is different from a color of the second subpixel positioned first in a side of the second side of the display region.

8. The display device according to claim 7, wherein the control circuit further includes a first control circuit configured to input a gate signal to the gate driver and input an emission signal to the emission driver, and configured to drive a gate line corresponding to a first subpixel positioned first in a side of the first side of the display region and drive an emission line corresponding to the first subpixel.

9. The display device according to claim 7, wherein the frame region is provided with a second gate driver and a second emission driver disposed along a third side facing the second side, at least one of the plurality of gate lines includes one end electrically connected to the gate driver and another end electrically connected to the second gate driver, and at least one of the plurality of emission lines includes one end electrically connected to the emission driver and another end electrically connected to the second emission driver.

10. The display device according to claim 7, wherein each of the plurality of pixels includes the subpixels of at least three kinds of color arrayed in a stripe arrangement.

11. The display device according to claim 7, wherein each of the plurality of pixels includes the subpixels of at least three kinds of color arrayed in a PenTile arrangement.

12. A method for manufacturing the display device according to claim 7, the method comprising:

observing an interior side of the frame;

detecting a first subpixel closest to a side of the first side of the frame;

detecting a second subpixel closest to a side of the second side of the frame;

storing the first subpixel and the second subpixel;

providing a first control circuit configured to input a gate signal to the gate driver and input an emission signal to the emission driver, and configured to drive a gate line corresponding to the first subpixel and an emission line corresponding to the first subpixel; and providing the second control circuit configured to constitute one pixel by the second subpixel and other subpixels of at least two kinds of color, and configured to input a control signal to the source driver and input a data signal to a data line, corresponding to the second subpixel, when color of a base end subpixel positioned first in a side of the second side of the active area is different from color of the second subpixel.

* * * * *